United States Patent [19]

Schwartzkopf et al.

[11] Patent Number: 4,970,194
[45] Date of Patent: Nov. 13, 1990

[54] METHOD OF PRODUCING SUPERCONDUCTING FIBERS OF YBA2CU3OX

[75] Inventors: Louis A. Schwartzkopf, Mankato, Minn.; Jerome E. Ostenson; Douglas K. Finnemore, both of Ames, Iowa

[73] Assignee: Iowa State University Research Foundation, Ames, Iowa

[21] Appl. No.: 383,872

[22] Filed: Jul. 21, 1989

[51] Int. Cl.$^5$ .................. F04B 41/88; H01B 12/04
[52] U.S. Cl. ......................... 505/001; 29/599; 148/404; 428/930; 505/704; 505/740
[58] Field of Search ............. 148/404; 505/1, 704, 505/740; 29/599; 428/930

[56] References Cited

U.S. PATENT DOCUMENTS

| 3,838,185 | 9/1974 | Maringer et al. | 264/8 |
| 4,479,528 | 10/1984 | Maringer et al. | 164/425 |
| 4,484,614 | 11/1984 | Maringer | 164/463 |
| 4,576,660 | 3/1986 | Rowe | 148/407 |
| 4,578,129 | 3/1986 | Rowe | 148/407 |
| 4,589,471 | 4/1986 | Gigliotti, Jr. et al. | 164/463 |
| 4,729,973 | 3/1988 | Brockway et al. | 501/95 |
| 4,733,816 | 3/1988 | Eylon et al. | 228/190 |
| 4,746,374 | 5/1988 | Froes et al. | 148/11.5 F |
| 4,770,850 | 9/1988 | Helmann et al. | 420/402 |
| 4,807,798 | 2/1989 | Eylon et al. | 228/190 |
| 4,809,903 | 3/1989 | Eylon et al. | 228/194 |
| 4,824,826 | 4/1989 | Damento et al. | 505/1 |

FOREIGN PATENT DOCUMENTS

| 0283024 | 9/1988 | European Pat. Off. | 29/599 |
| 0285168 | 10/1988 | European Pat. Off. | 29/599 |
| 0285169 | 10/1988 | European Pat. Off. | 29/599 |
| 0288711 | 11/1988 | European Pat. Off. | 29/599 |
| 0318025 | 12/1988 | Japan | 505/740 |
| 0007434 | 1/1989 | Japan | 505/740 |
| 0015905 | 1/1989 | Japan | 29/599 |

OTHER PUBLICATIONS

S. Jin et al., "Fabrication of Dense $Ba_2YCu_3O_7$-Superconductor Wire," *Appl. Phys. Lett.*, vol. 51, No. 12, Sep. 21, 1967, pp. 943-945.
R. W. McCallum, "Problems in the Production of $YBa_2Cu_3O_x$ Superconducting Wire," *Advanced Ceramic Materials* (American Ceramic Society Publication), vol. 2, No. 3B, Jul. 1987, pp. 388-400.
Tomoko Goto et al., "Preparation of High-$T_c$ Y-Ba-Cu-O Superconducting Filaments by Suspension Spinning Method," *Japanese Journal of Applied Physic* vol, 26, No. 9, Sep. 1987, pp. L1527-L1528.
"Low Temperature Fabrication of Superconducting Thin Films," *IBM Technical Disclosure Bulletin*, vol. 30, No. 12, May 1988, p. 116.
M Kao, "Synthesis of Y-Ba-Cu-O Superconductors From $Y_2O_3$, $BaO_2$ and $Cu_2O$: The Optional Oxygen Treatment," *Materials Letters*, vol. 6, No. 3, Dec. 1988, pp. 53-57.

*Primary Examiner*—Upendra Roy
*Attorney, Agent, or Firm*—Zarley McKee, Thomte, Voorhees & Sease

[57] ABSTRACT

Fibers of $YBa_2Cu_3O_x$ have been produce by pendant drop melt extraction. This technique involves the end of a rod of $YBa_2Cu_3O_x$ melted with a hydrogen-oxygen torch, followed by lowering onto the edge of a spinning wheel. The fibers are up to 10 cm in length with the usual lateral dimensions, ranging from 20 $\mu$m to 125 $\mu$m. The fibers require a heat treatment to make them superconducting.

7 Claims, No Drawings

METHOD OF PRODUCING SUPERCONDUCTING FIBERS OF YBA2CU30X

GRANT REFERENCE

This invention was made with Government support under Contract No. W-7405-ENG82 awarded by the Department of Energy. The Government has certain rights in the invention.

BACKGROUND OF THE INVENTION

This invention relates to superconductive metal oxide ceramics, in particular to $YBa_2Cu_3O_x$, wherein x equals from 6.9 to 6.98.

The technology of superconductivity, particularly metal oxide ceramics which conduct electricity with no resistance at temperatures above the boiling point of liquid nitrogen, unlike previously known materials that can superconduct only near absolute zero, has been rapidly developing. These materials, i.e. certain metal oxide ceramics, can conduct electricity with no resistance at temperatures above the boiling point of liquid nitrogen (77° K or −196° C.). The discovery of these materials has been quite recent and the demand for practical application of these materials will be ever increasing in the future. In particular, it is desirable to develop these new metal oxide ceramics, particularly $YBa_2Cu_3O_x$, wherein x equals form 6.9 to 6.98 into useful conductor shapes such as wires, films, or thin sheets.

An enormous amount of effort is being devoted to exploring ways of making wire out of the new high temperature superconductors. In many applications a composite multi-filamentary wire will be required. Such wire cannot be made by drawing rods into filaments because of the extreme brittleness of the new materials.

Accordingly, there is a continuing need for alternative methods of making filaments of the high temperature superconductor $YBa_2Cu_3O_x$. This invention has as its primary objective the fulfilling of this need.

The conditions under which the ceramic is prepared affect the oxygen content. This is important because structural studies have shown that the number and arrangement of oxygen atoms in the lattice is a key determinate of the oxide superconductive properties. In fact, to produce the highest superconductive transition temperatures, the ceramic should be heated in an atmosphere that has some oxygen present, some workers have even said pure oxygen. For further details of superconductivity of $YBa_2Cu_3O_x$ ceramic, see *Chemical Engineering and News*, May 11, 1987, pp. 7-16.

A primary objective of this invention is to use the pendant drop melt extraction technique to produce superconductor fibers in a manner in which the superconductivity is not permanently destroyed by the process of pendant drop melt extraction. This has heretofore not been achievable, primarily because the conditions normally utilized for pendant drop melt extraction affect the oxygen content of the ceramic as well as the formation of new phases and may destroy superconductivity.

SUMMARY OF THE INVENTION

In accordance with this invention, $YBa_2Cu_3O_x$ is melted with a hydrogen-oxygen torch and lowered onto the edge of a spinning wheel. The wheel has a large temperature differential from the liquid ceramic, and as a result fibers of up to 10 cm in length are produced by freezing onto the wheel. Usually the lateral dimensions of the fibers range from 20 $\mu$m to 125 $\mu$m. The fibers thereafter are heat treated to make them superconducting.

DETAILED DESCRIPTION OF THE INVENTION

Pendant drop melt extraction is a known technique for forming fibers, and it was developed in the 1970's as an alternative to drawing through a, R. E. Maringer and C. E. Mobley, *J. Vac. Sci. Technol.* 11 (1974) 1067. However, pendant drop melt extraction does subject the ceramic to a variety of hot-cold conditions and has therefore not to this time been necessarily considered useful for forming fibers of superconductor ceramics such as $YBa_2Cu_3O_x$.

The key to the present process is employing an environmental excess of oxygen in the initial melt step, followed by contacting the melted ceramic drops with a cool spinning wheel rotating at carefully controlled linear speeds, followed by a heat treatment of the fibers within a defined temperature range in an oxygen enriched environment to allow ceramic crystals to form within the extracted fibers, followed by slow cooling in an oxygen enriched environment, and finally more rapid cooling to room temperature. When this is done, superconducting fibers up to 10 cm long have been produced.

The initial starting material, that is the superconductive metal oxide ceramic having a formula $YBa_2Cu_3O_x$ may be the ceramic produced in accordance with U.S. Pat. No. 4,824,826, commonly assigned and issued Apr. 25, 1989. In accordance with this technique and in the first step, the ceramic is heated to a temperature of from about 1100° C. to about 1500° C., preferably about 1100° C. to 1360° C. in an oxygen enriched environment. The most effective heating is done with a rod of the ceramic with the tip of the rod melted at its bottom end with a hydrogen-oxygen torch, or with another heating device which has an oxygen rich atmosphere. This forms a liquid drop. When it is evident that a liquid drop of the ceramic has formed, it is then lowered onto the edge of a spinning brass wheel which typically has a 3" diameter and an angle of 90° at the knife edge.

The wheel is typically spinning at a linear speed at the wheel edge of from about 1 meter per second to about 5 meters per second, preferably from about 1 to about 2 meters per second. The temperature of the spinning wheel is not critical, but commonly may be about 200° C. As a result, the liquid freezes on the edges of the spinning wheel, and as the wheel spins a filament is formed. As the wheel spins, the filament cools, contracts, and is thrown off the wheel and collected. If desired the wheel may be notched to control fiber length.

It has been found that in the first step of this process, that is the step involving the heating of the ceramic it is essential that an excess of oxygen be utilized. That is, the environment must be oxygen enriched. The precise amount of oxygen used in the torch flame to form the liquid is not critical, except that an excess of the stoichiometric amount must be utilized. A good visual measurement is when the flame contacting the ceramic is burning a good clear blue color as opposed to a green color, it is self-evident that an oxygen enriched environment is occurring.

The fibers which form on the spinning wheel tend to be more uniform in both length and thickness toward the lower end of the linear speed range for the spinning wheel.

These fibers, once formed, in some occasions have a circular cross-section but in most instances are somewhat ribbon-like. Their diameters will range from 40 μm to 60 μm with the thickness of the ribbons varying from 20 μm to 40 μm and their widths varying from 50 μm to 125 μm. By notching the wheel, fibers of uniform length of about 4 cm can be produced.

The fibers are not superconducting at this point. It has been found necessary and it is a critical part of this invention to heat treat the fibers in flowing oxygen to allow the phases present to react and reform $YBa_2Cu_3O_x$. Heat treating of the fibers may be at a temperature within the range of from about 930° C. to about 980° C. in an oxygen enriched environment for from about 12 hours to about 24 hours. This can be done in a ceramic furnace which is continually flushed with oxygen.

Following the heat treatment, fibers are then slowly cooled in an oxygen enriched environment again to a temperature at least 500° C. and more preferably to a temperature of 450° C. This slow cool can occur for from about 12 hours to about 16 hours, and allows oxygen to intercalate or diffuse into the ribbons along the copper oxide chains. A slow cool may last up to 24 hours.

The slow cool is followed by a relatively rapid cooling period. In the rapid cooling, cooling occurs down to room temperature over about two hours. The preferred cooling rate is at about 100° C. per hour.

When this process is performed the resulting fibers will exhibit large intragranular critical current densities at low temperatures, but also low transport critical current densities. The resulting fibers are quite brittle. For end use, those fibers may thereafter be coated with silver and embedded in a copper matrix or other highly conducting matrix material.

EXAMPLE

A rod of $YBa_2Cu_3O_7$ was pendant drop melt extracted in the following manner. The tip of the rod was heated with a hydrogen-oxygen torch to form a liquid drop. The drop was lowered onto the edge of a spinning brass wheel having a 3" diameter and an angle of 90° at the knife edge. The wheel was at approximately 200° C. The liquid froze on the edge of the wheel. The wheel was rotating at linear speed at the wheel edge of about 2 meters per second. As the filament cooled it contracted and was thrown off of the wheel and collected. The fibers ranged in length from 1 cm to 5 cm.

Magnetization measurements with a Quantum Design magnetometer showed that the as-spun fibers were not superconducting. X-ray diffraction on the as-spun fibers showed no $YBa_2Cu_3O_7$ lines; rather, the sample was composed of amorphous material, $Cu_2O$ and possibly $Y_2O_3$. Energy dispersive spectroscopy showed more oxygen in heat treated than in as-spun fibers by a ratio of 1.17 or about 7 to 6, indicating approximately six oxygen atoms per formula unit in the as-spun fibers.

Heat treating the fibers in flowing $O_2$ allows the phases present to react and re-form $YBa_2Cu_3O_7$. In a typical fiber, heat treated at 955° C. for 16 hours then cooled at 75° C. per hour, all in flowing $O_2$, magnetization measurements showed a sharp transition at 88 K; at 10 K, the lowest temperature measured, the fiber screens 98% (and expels 42%) of the applied field of 100% aerosteds, which indicates that it consisted mostly of bulk $YBa_2Cu_3O_x$, and that relatively little second phase was present.

Magnetization hysteresis curves up to 2 T at temperatures T=60 K and 4.2 K were obtained for the same fiber. The intragranular magnetization critical current density $J_{cm}$, calculated from the Bean model (*Physical Review Letters*, Vol. 8, p. 250 (1962)), assuming a grain size of 6 μm, was found to be comparable to that usually seen in bulk ceramics. At 4.2 K, $J_{cm}$ is greater than $10^6$ A/cm$^2$ for fields up to 1 T, and falls off more rapidly than the 4.2 K data as the field increases. The transport critical current density $J_{ct}$ of two different fibers was measured by a standard four-probe technique at 77 K in zero field and found to be on the order of 10 A/cm$^2$, implying poor grain-to-grain coupling.

After heat treatment to make the fibers superconducting, the fibers exhibit large intragranular critical current densities at low temperature, but low transport critical current densities. These fibers are ready for textured growth in a steep temperature gradient for the next step in fiber development.

It therefore can be seen that the invention accomplishes at least all of its stated objectives.

What is claimed is:

1. A method of pendant drop melt extraction forming of superconductive fibers of $YBa_2Cu_3O_x$, consisting essentially of:
   (a) heating to a temperature of from about 1100° C. to about 1500° C. in an oxygen enriched environment, a superconductive ceramic of the formula $YBa_2Cu_3O_x$ wherein "X" equals from about 6.9 to about 6.98 to provide liquid drops of said ceramic;
   (b) contacting said drops with an edge of a cool wheel rotating at a linear speed of from about 1 m/sec. to about 5 m/sec. which results in formation of fibers from said liquid drops on said wheel;
   (c) heat treating said fibers at a temperature at from about 930° C. to about 980° C. in an oxygen enriched environment for from about 12 hours to about 24 hours to allow crystals of $YBa_2Cu_3O_x$ to form within said fibers;
   (d) slowly cooling said fibers in an oxygen enriched environment to a temperature of at least 500° C.; and thereafter
   (e) more rapidly cooling said fibers to room temperature.

2. The method of claim 1 wherein the heating in step (a) is from about 1100° C. to about 1360° C.

3. The method of claim 1 wherein the heating treatment of the fibers in step (c) is at a temperature of from about 940° C. to about 960° C.

4. The method of claim 1 wherein the slow cooling is to a temperature of at least 450° C.

5. The method of claim 1 wherein the rapid cooling is at a rate of from about 80° C. to about 100° C. per hour.

6. The method of claim 2 wherein the temperature of the cool wheel is from about 100° C. to about 300° C.

7. The method of claim 4 wherein the slow cool is conducted from about 16 hours to about 24 hours.

* * * * *